(12) United States Patent
Detig

(10) Patent No.: US 7,094,627 B2
(45) Date of Patent: Aug. 22, 2006

(54) PROCESS FOR THE MANUFACTURE OF LARGE AREA ARRAYS OF DISCRETE COMPONENTS

(75) Inventor: Robert H. Detig, New Providence, NJ (US)

(73) Assignee: Electrox Corporation, NJ (US)

( * ) Notice: Subject to any disclaimer, the term of this patent is extended or adjusted under 35 U.S.C. 154(b) by 0 days.

(21) Appl. No.: 10/502,699

(22) PCT Filed: Mar. 4, 2004

(86) PCT No.: PCT/US2002/006279

§ 371 (c)(1),
(2), (4) Date: Feb. 8, 2005

(87) PCT Pub. No.: WO02/071465

PCT Pub. Date: Sep. 12, 2002

(65) Prior Publication Data

US 2005/0176170 A1   Aug. 11, 2005

Related U.S. Application Data

(63) Continuation of application No. 60/272,595, filed on Mar. 2, 2001.

(51) Int. Cl.
*H01L 21/44* (2006.01)
(52) U.S. Cl. .................. 438/106; 438/106; 438/49; 438/101
(58) Field of Classification Search ............... 438/106, 438/49, 101
See application file for complete search history.

(56) References Cited

U.S. PATENT DOCUMENTS 6,361,912 B1 * 3/2002 Fonash et al. ............... 430/52

\* cited by examiner

*Primary Examiner*—David Nelms
*Assistant Examiner*—Thinh T Nguyen
(74) *Attorney, Agent, or Firm*—Synnestvedt Lechner & Woodbridge LLP

(57) ABSTRACT

Electrostatic printing methods are used to allow the precise placement of small, discrete components on a substrate. The components are configured as liquid toners by coating one or more surfaces with a charge control agent which reacts with a charge director in a diluent to create a charge on the coated components allowing them to be manipulated and placed using electrical fields.

12 Claims, 6 Drawing Sheets

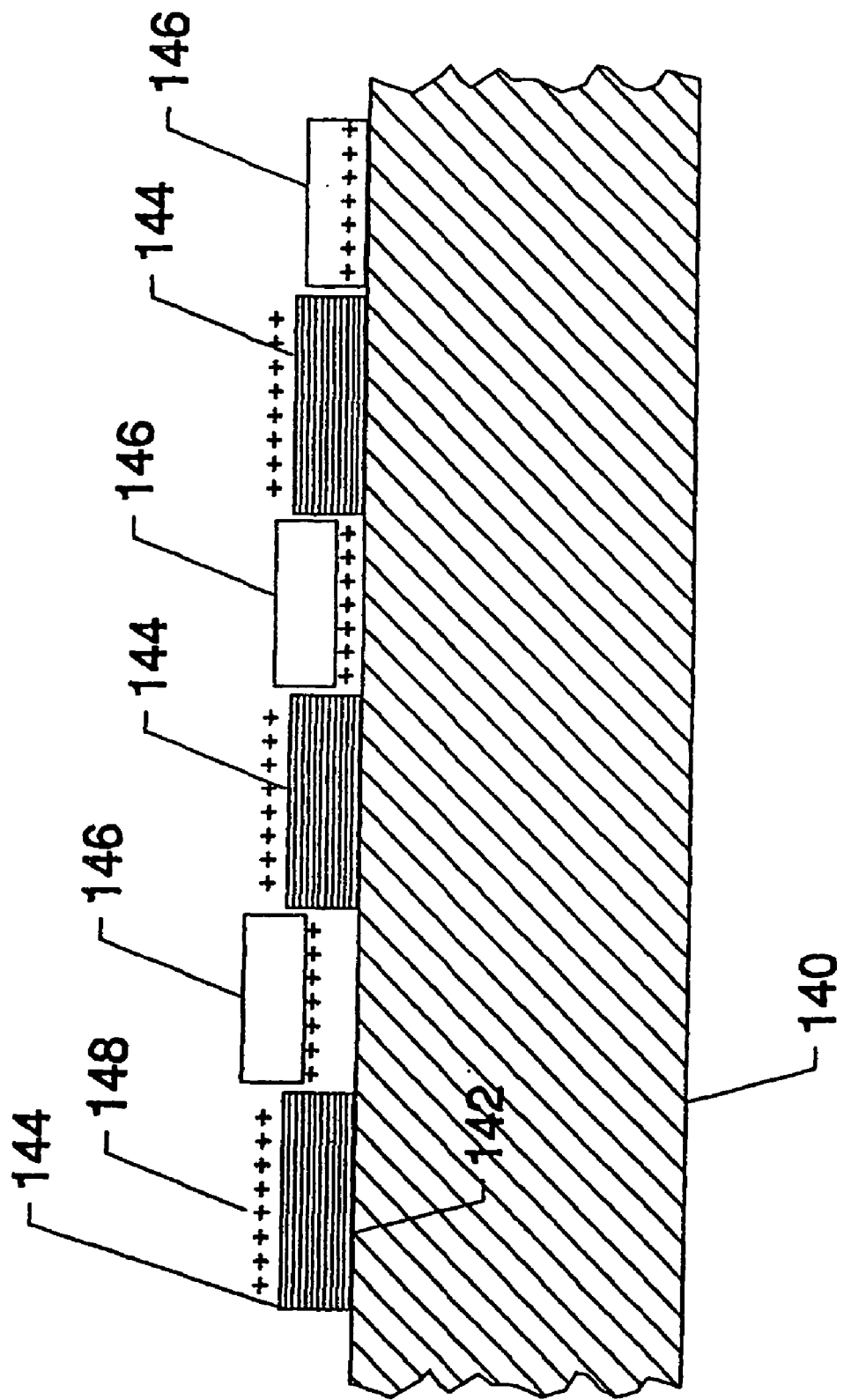

PROCESS FOR THE MANUFACTURE OF LARGE AREA ARRAYS OF DISCRETE COMPONENTS

CROSS REFERENCE TO RELATED APPLICATIONS

This application claims the priority of PCT application Ser. No. PCT/US02/06279 filed on Mar. 4, 2002 and U.S. Provisional Patent Application Ser. No. 60/272,595 filed on Mar. 2, 2001, the entire contents of both of which are hereby incorporated by reference.

BACKGROUND OF THE INVENTION

1. Field of the Invention

This invention describes a manufacturing process for producing large physical area arrays of discrete components, more particularly to electro-photographic methods which can produce arrays of small components such as transistor circuits useful, for example, for flat panel displays.

2. Description of the Related Art

The most common flat panel display is the Active Matrix Liquid Crystal Display, typically used in lap top computers. In an active matrix each "pixel" location has a functioning transistor that switches "On" and "Off" the voltage to that pixel. The transistor modulates the voltage to achieve levels of brightness for continuous "tones" in the picture. The manufacture of the active array of transistors is a time-consuming, expensive task. Beginning with an X-Y grid of metallized conductors and transparent electrodes, the transistors are formed in a layered pattern using sputtering and photolithography. The lithographic steps consist of:

A). spin coating an etch resist
B). soft bake to harden resist
C). photo expose
D). develop: i.e., wash away unexposed resist
E). cure remaining resist by baking
F). etch material underneath
G). strip away the resist.

Between steps B and C the substrate must be cooled back to room temperature otherwise thermal expansion will result in mechanical alignment errors.

The formation of the simple transistor, usually a Field Effect Transistor (FET) requires the following layers, each of which is photolithographically patterned:

1. Amorphous silicon layer
2. Silicon nitride dielectric layer
3. Adhesion layer
4. Metallization layer of Aluminum, Two of the layers (1 and 3) are formed in an expensive vacuum sputtering chamber, while layer 4 is formed in a somewhat less expensive vacuum thermal evaporation process. Each of the layers is patterned by the 7 step photolithographic process previously described for a total of 35 steps.

There is a desire for flat panel displays to be very large, perhaps one meter in diagonal. The above process is costly for very small panels, to scale it to "meter" dimensions has proved difficult despite $10's of billions and two decades of research worldwide.

Part of the difficulty of the above process is that the quality of the amorphous silicon is marginal, at best. It has very low "minority carrier mobility" (carrier velocity per unit of electric field) compared to the single crystal silicon (from wafers) that is used to make all other integrated circuits. To this end, an improvement could be effected if the amorphous silicon could be crystallized resulting in substantial improvements in performance. If the amorphous silicon can be crystallized and transformed to "Poly Si", then other circuits can be incorporated into the display beyond the transistor at each "pixel" element (e.g., the "Housekeeping" circuits like row and column drivers, data shift registers, etc.). This would also substantially reduce the interconnects required and lower the cost.

Substantial research has been executed attempting to produce such "poly" silicon. High powered lasers "Zap" the amorphous silicon, raising its temperature thereby crystallizing it. Solid phase crystallization through the agent of a catalyst like palladium or other metal with heating to 600° C. for 10 minutes has been disclosed (see Fonash, U.S. Pat. No. 5,275,851). But none of the "poly Si" processed have been successfully commercialized.

Many people have proposed mounting "real silicon" die, cut from a silicon wafer. These parts may be as small as 100×100 microns in dimension. They would be very inexpensive themselves; however, the problem would be in applying them at each fixed location. In a very high resolution display there may be as many as 3 million pixels, each of 3 colors, for a total of 9 million "pixels" meaning 9 million transistors that need to be properly and precisely located.

One approach to this problem is that of Alien Technology of Hayward, Calif. Alien describes die that are fabricated with beveled rear faces and are "fluidically" located in a preformed back plate, to "micron tolerances". This back plate is part of the final product and is shipped "out the door" to the customer. Furthermore there are no "imaging forces" that move the "die" into the preformed cavities. The only force available is that of gravity.

There remains the need to assemble discrete active silicon parts; cheaply and massively that this invention is presented.

The basic technology of "electrophotography" or images made by electrical forces is approximately 50 years old and generates approximately $100 billion in revenue, worldwide. Its legacy includes the copy machine and the laser printer. In virtually all manifestations the machines put a colored resin toner on a sheet of paper for a human being to read. In recent years the Electrox Corp. of Denville, N.J. has pioneered the use of the technology as a manufacturing tool; printing functional materials configured as liquid toners, on metal, glass and even paper surfaces. Toners include Metals (Ag, Al); Catalysts (Pb, Sn); Dielectrics (Glass, Phosphors); and Resins (Etch resists, Color Filter Materials, Organic LED Materials).

SUMMARY OF THE INVENTION

The invention extends electrostatic printing technology to precisely place a plurality of components on a substrate. This method allows the placement of components ranging in size from sub-micron up to 0.1 inches in size. The components are coated on one or more surfaces with a charge control agent and are then dispersed in an aliphatic hydrocarbon diluent, already containing a suitable charge director material. The interaction of the charge control agent, bonded to the components and the charge director in the diluent, produce acid/base reactions that impart an ionic charge to the component/toner particle and produces oppositely charged inverse "micelles" in the diluent This yields a liquid electrophoretic toner. The components now possess a stable electric charge and can be moved, imaged and transferred from one surface to another using electric fields.

BRIEF DESCRIPTION OF THE DRAWINGS

FIG. 6 is an illustration of an image mask as part of the final substrate.

DESCRIPTION OF THE INVENTION

The invention extends electrostatic "toner technology" to the printing of physical components on a variety of final substrates. The components are configured as liquid toner materials which enables their use in electrostatic printing processes. This method allows the precise placement of components ranging in size from sub-micron up to 0.1 inches in size.

Figure 1:
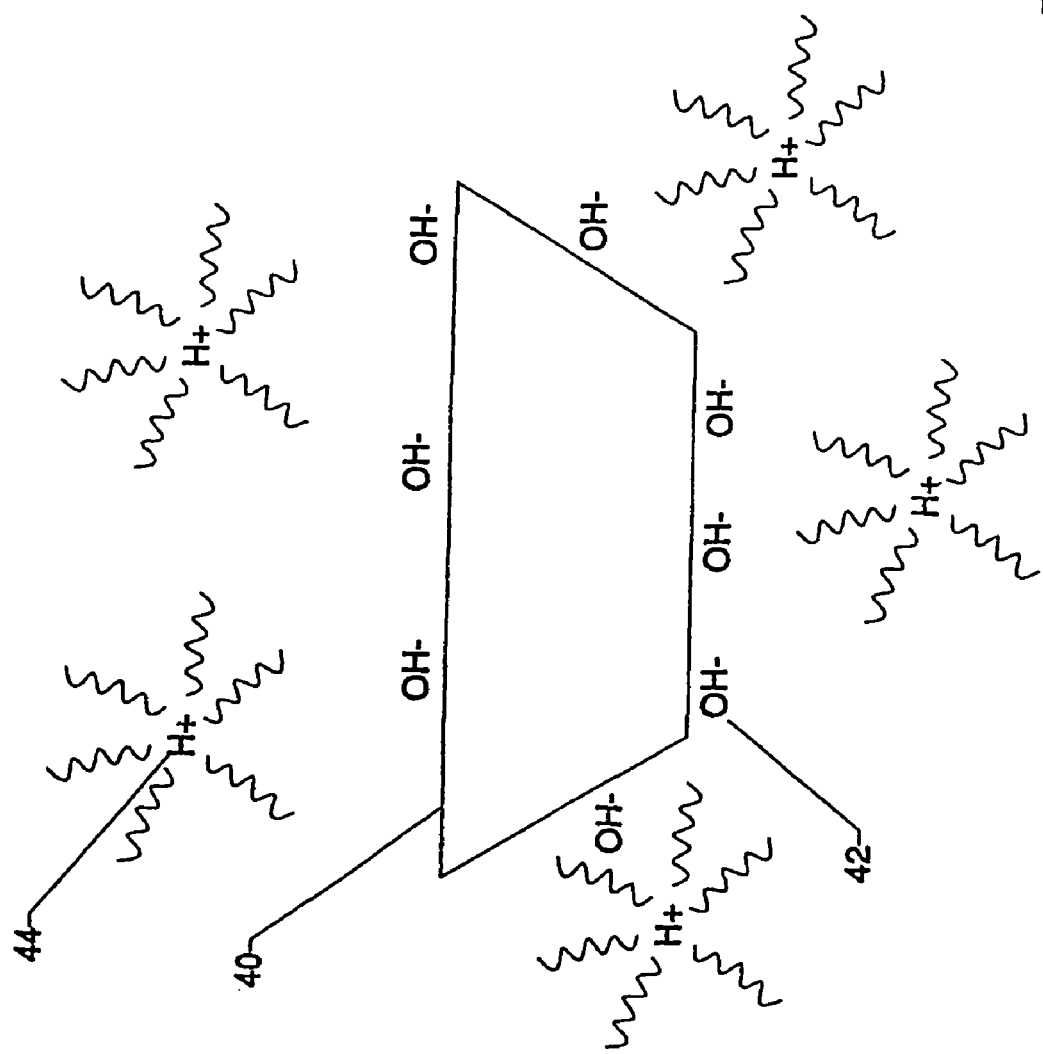
FIG. 1 is an illustration of a silicon "die" toner particle with a net negative charge surrounded by positively charged inverse micelles in a diluent liquid.

In one embodiment, FIG. 1, the components are "active matrix" transistors which are small silicon die on the order of 100 micron by 100 micron. These silicon die are temporarily coated with a charge control agent and then dispersed in an aliphatic hydrocarbon diluent, already containing a suitable charge director material. The interaction of the charge control agent, bonded to silicon die and the charge director in the diluent, produce acid/base reactions that impart an ionic charge to the toner particle and forming oppositely charged inverse "micelles" in the diluent. This yields a liquid electrophoretic toner. The silicon die now possess a stable electric charge and can be moved, imaged and transferred by electric fields from one surface to another. Silicon die 40 shown in FIG. 1 are shaped like pyramids with the top chopped off. They are coated with a thin layer of charge control agent, which interact with the charge director material to form inverse micelles 44, positive hydrogen ions in the hydrocarbon diluent and hydroxyl ions 42 (negative charged) attached to the charge control agent. The toner particle (the "die") now has a negative charge. As such it can be "imaged" by electric fields and transferred from one surface to another with electric fields.

The charge control agent is a material that coats the silicon die toner particle and forms acid/base reactions with the charge director material dissolved in the Isopar diluent. These charge control materials can be photo-lithographically applied to the front or back side of the die (the non-active region) or even an overall coating. Since some coatings can be as thin as molecular mono-layers, and selective (on the passivation layer of the die, but not on the input/output metal contacts); they can remain in place and never need to be removed. These materials can include photo-imagable materials like: epoxy cationic, photosensitized polyimide and acrylic free radical, etc. or the broad overall coating agents like organo-silanes and organo-titinate or aluminate coupling agents. Examples of suitable charge control agents. include, but are not limited to, Cyclotene® (Dow Chem. Midland, Mich.), AZ9260 (Clariant Chemical), SU8 (MCM Corp., Newtown, Mass.) and Dynamask® #5030 Solder Mask (Dynachem, Calif.).

Compounds which can be used as charge directors are polar or non-polar and are compatible with the diluent used and provide an acid/base moiety which can react with the complimentary acid/base moiety on the charge control agent. Examples of such compounds include, but are not limited to: basic barium petronate (available from e.g., Cromptom Corp, Connecticut), Zirconium Hexchem (commercially available from (NSG America, Cleveland) and #1276 (from Hunt Imaging of Varin, Ohio).

Suitable diluents/solvents include, but are not limited to, Norpar® (Exxon), Isopar® (Exxon), silicon oils and ShellSol® (Shell Oil).

Figure 2:
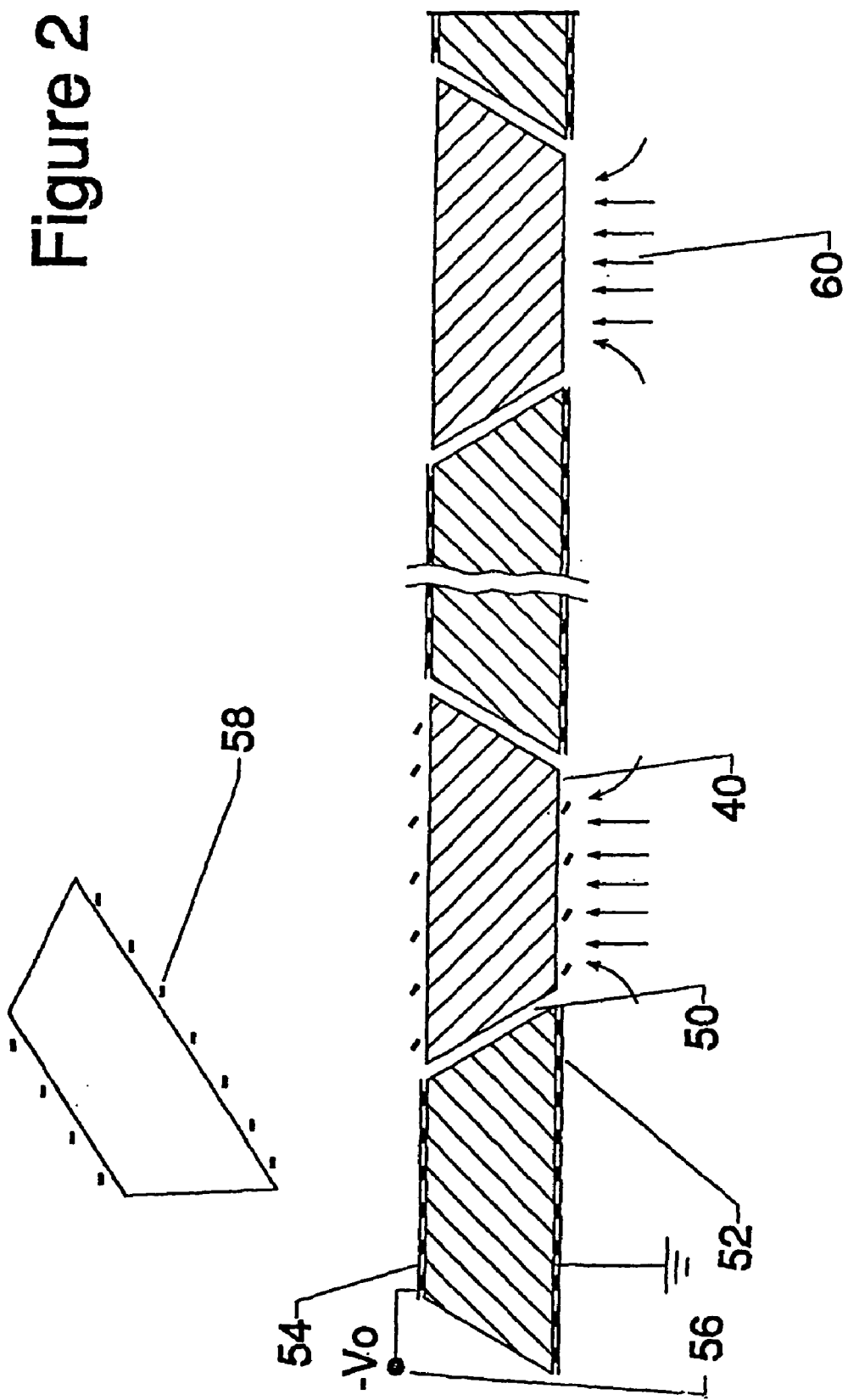
FIG. 2 is an illustration of a master template electrostatic printing plate onto which silicon die toner particles are being attracted.

In FIG. 2, image plate 50 has inverse pyramidal cavities molded or ground in to it at the exact locations, for precise component placement Plate 50 is coated on top and bottom with electrically conducting layers 54 and 52 respectively. A voltage (of the opposite polarity of the charge on the charged components) 56 is applied between 54 and 52. Electric fields from this plate draw toner particles 58 into their proper locations in the image plate 50. In a preferred embodiment, diluent 60 is lightly pumped from below to push away components not properly oriented into the cavities of plate 50. Properly oriented components are strongly pulled into the cavities in the plate 50 and are securely held there.

Figure 3:
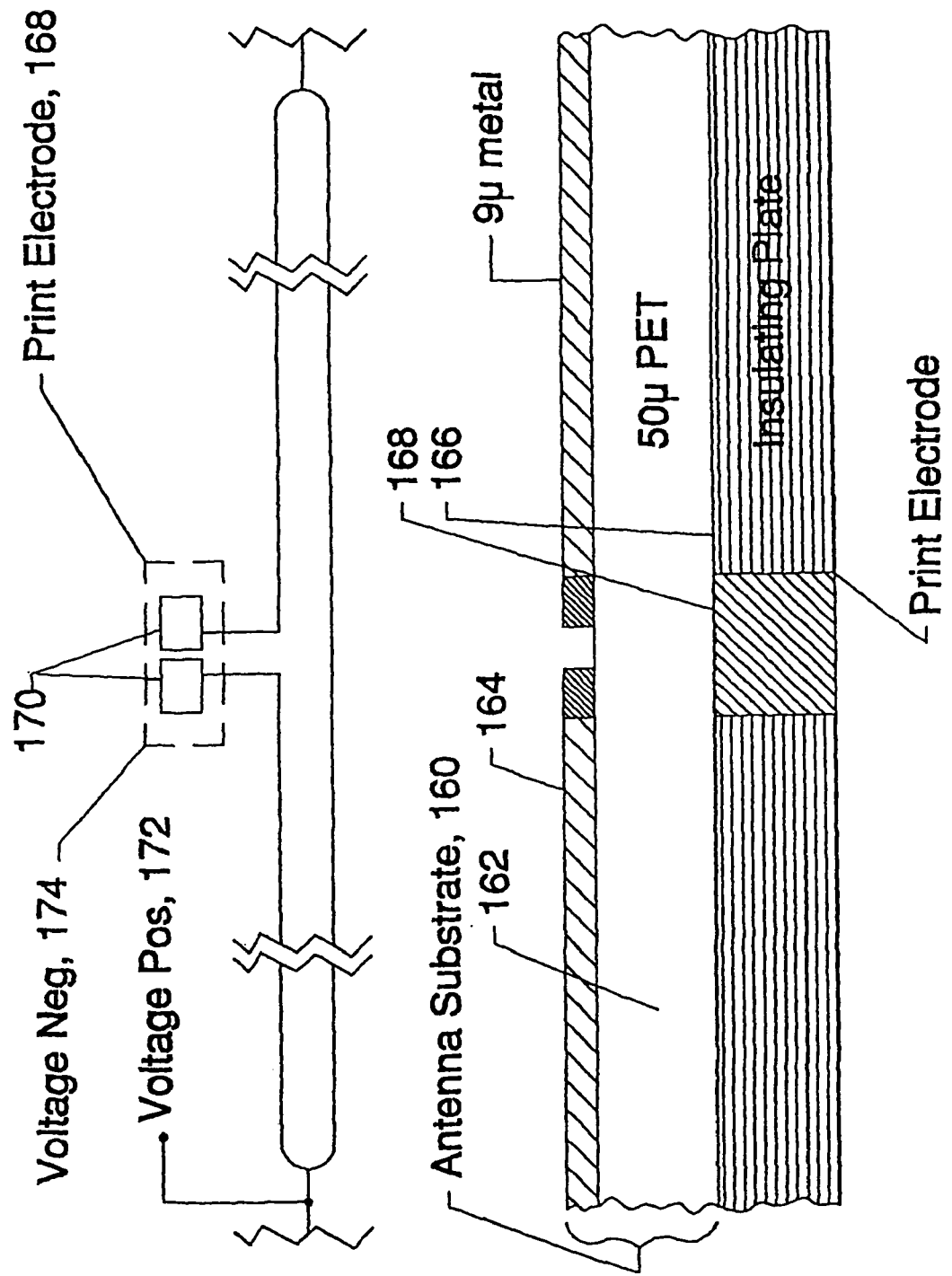
FIG. 3 is an illustration of the production of an RFID device.

FIG. 3 shows another embodiment of the invention where it is used to manufacture inexpensive radio frequency identification devices. Antenna substrate 160 consists of film or paper substrate 162 with an etched metal pattern 164. It is desired to place the silicon die toner particles on the two electrodes of the antenna, 170. Antenna 160 is placed on insulating plate 166 which contains print electrode 168. A positive voltage 172 is applied to the antenna metal 164 (by means not shown). An appropriate negative voltage 174 is applied to the print electrode 168 in an insulating platen 176 (by means not shown). The fringing electric fields from these voltages cause a negatively charged silicon die to be attracted to the electrodes 168 only.

Figure 4:
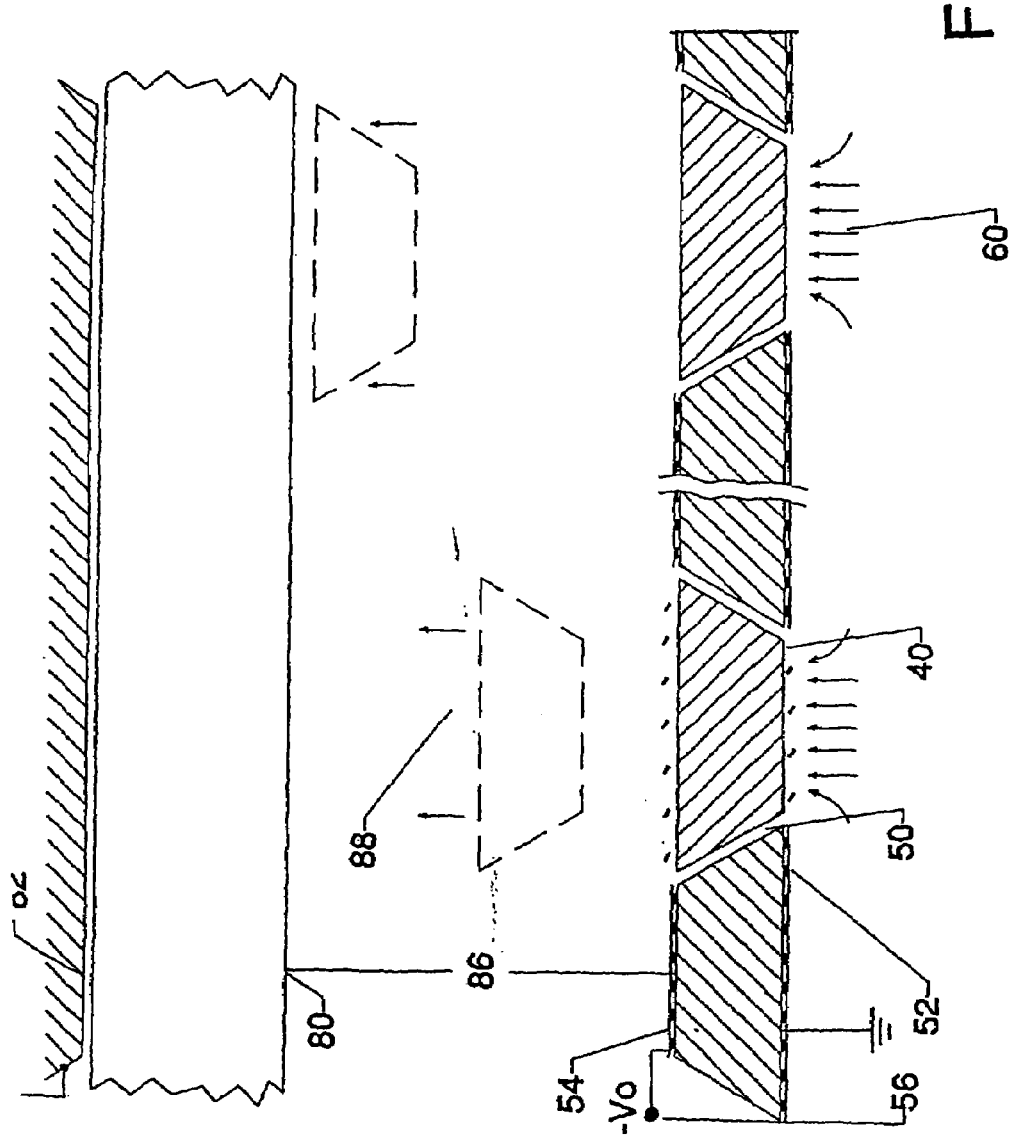
FIG. 4 is an illustration of the silicon die toner particles being transferred from the master template to the receiving plate or flexible film, and the end product.

FIG. 4 illustrates the transfer step. Image plate 50 can be expensive and preferably is reused. It can be quite large, for example a meter by meter, quite thin less than 5 mm (preferably about 1 mm) and has perhaps one to two million cavities ground into it. The image plate is used as an assembly fixture to transfer the components to a receiving surface, such as glass or polymeric film.

In FIG. 4 plate 50, imaged with a complete array of silicon die 40, is spaced away from receiving surface 80 by a mechanical gap 86. Means for this spacing are not shown but are known in the art. Mechanical gap 86 is filled with diluent fluid 88 to allow the toner die to be transferred using methods known in the art, e.g., in the disclosure of Bujese (U.S. Pat. No. 4,786,576). Imaging voltage 56 is removed and the transfer voltage 84 connection to back electrode 82 is activated. "Toner" die 40 now precisely transfer across gap 86 to receiving surface 80 by action of the electric field produced by voltage 84 connected to plate 82.

The receiving surface 80 and image plate 50 are now mechanically separated with voltage 84 retained to hold the toner die 40 in place.

During pre-transfer assembly of receiving surface 80 and image plate 50 voltage 84 might be adjusted to hold the toner die 40 rigidly in place. Similarly during separation of the plate, image voltage 56 might be adjusted to perform the same function of holding the transferred die in place on the receiving substrate.

Figure 5:
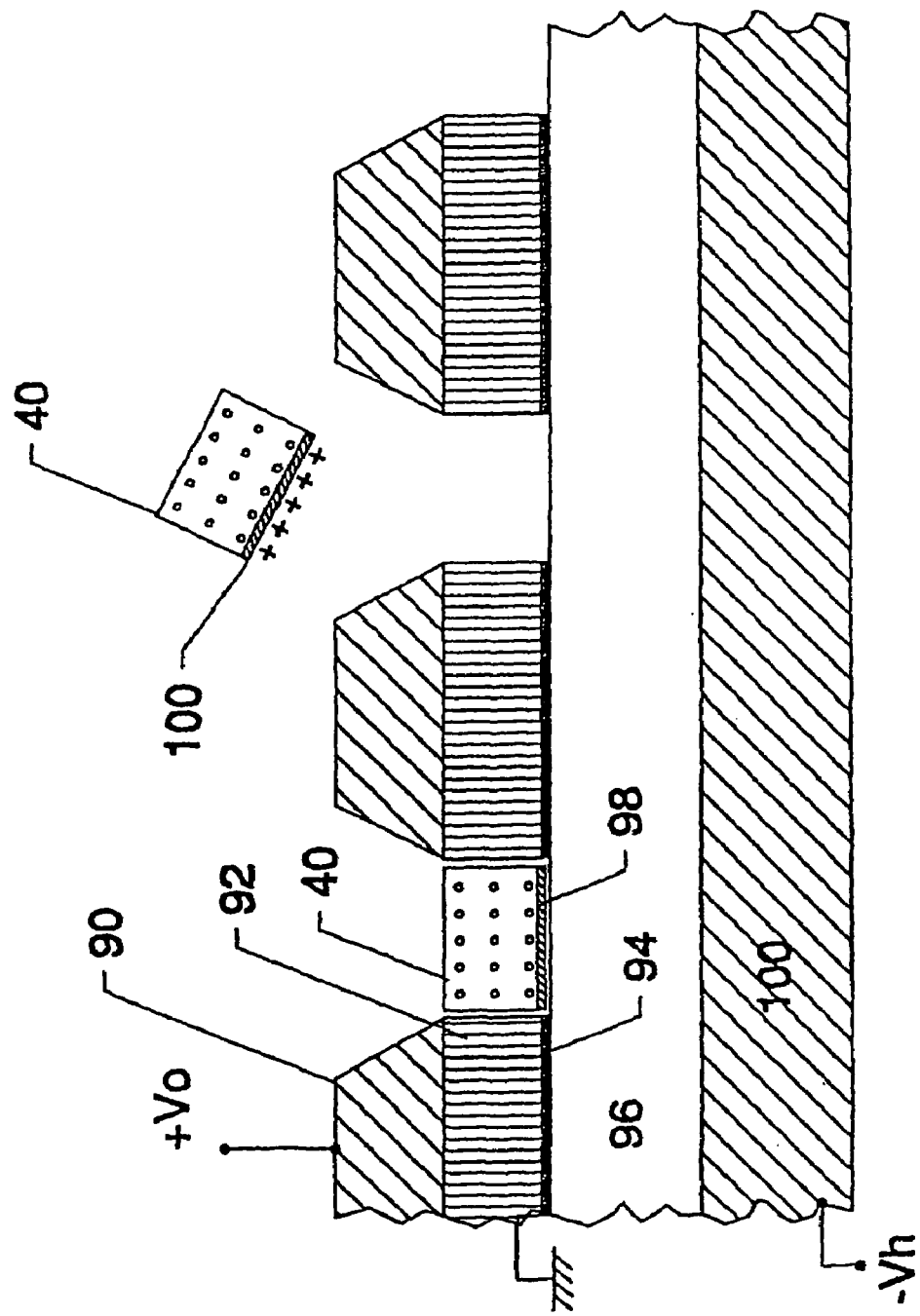
FIG. 5 is an illustration of a configuration in which the toner die are imaged directly to a final substrate.

FIG. 5 shows an alternate embodiment of the invention wherein the silicon die toner particles are placed on the receiving object in one step (without the transfer step) with the aid of an image defining or placement mask 90. This placement mask is an etched metal mask that serves as a mechanical support much like that of a solder paste stencil used in the printed wiring board industry. It is preferably etched from the top only to produce the tapered entry ways into the holes. After etching stencil 90 is coated by photopolymer 92 (for example, either dry film or liquid photopolymer, or the like) which is photo-lithographically imaged in an identical pattern as the stencil 90. Finally cured photopolymer 92 is coated with a thin metal layer 94 by sputtering, vacuum evaporation or any other means.

Now receiving sheet 96 is placed on chuck 100 with imaging mask (90, 92, 94) placed on top. Layer 94 is grounded and mask 90 is raised to a suitable positive potential, —Vo. The manifold structure is flooded with liquid toner diluent containing a dissolved charge director (both not shown) and also containing toner die 40 coated with charge control agent 98, on the active side only of the silicon die (where the transistors, diodes, passive components and interconnects are located). The charge control agent 98 forms acid/base couples with charge director (not shown) imparting a charge to the die, in this case a positive charge.

After all holes are filled with die, voltage Vo is reduced to zero and holding voltage –Vh is applied while the stencil structure (90-92-94) is removed leaving all die in place.

FIG. 6 shows another alternate embodiment of the invention wherein the patterning or positioning mask of the invention remains with the final product. The substrate of the final product 140 contains surface circuit patterns, not shown, and an anti-static layer 141. The circuitry on the substrate is preferably low voltage and relatively high current (microamperes) and is compatible with anti-static layers which are of the order of 10+8 ohms per square and conducts currents of the order of pico amperes during the charging step.

Substrate 140 with anti-stat layer 142 is coated with photopolymer 144 which is photo-lithographically patterned as shown, yielding cavities in the desired locations. Photopolymer 144 is now charged by a corona unit (not shown) resulting in a latent image of charges 148 as illustrated in FIG. 6.

Liquid toner containing die 146 floods the plate and depositing die 146 in the cavities indicated. These die are subsequently fixed in place by a method known in the art, such as by a heat of pressure bonding step of ordinary means.

The following examples will further describe the invention. These examples are intended only to be illustrative. Other variations and modifications may be made in form and detail described herein without departing from or limiting the scope of the invention which is determined by the attached claims.

EXAMPLE I

A silicon wafer is spin coated with an approximate 5 micron thick layer of DuPont Pyralin™ photo imageable polyimide resin. The Pyralin is processed by normal means of prebake, exposure, image development and post bake cure. The cured Pyralin serves as a tough moisture/sodium barrier thereby protecting the silicon from future degradation.

The wafer is singulated into individual die that are dispersed in a diluent (Isopar™ G solvent, Exxon). 4 gm of silicon die are dispersed in 50 ml of diluent. A charge director material, Indigo Imaging agent (Indigo of America, Inc., Woburn, Mass.) is added to the mix. 0.1 ml charge director per 50 ml of diluent/die mix. The mix is now gently agitated for 30 minutes with a magnetic stir bar. The toner mix is allowed to stabilize for 12 hrs. after stirring.

During subsequent imaging tests the silicon die toner particles are found to possess a substantial negative "zeta" potential charge.

While the invention has been described with reference to the preferred embodiments thereof, it will be appreciated that various modifications can be made to the parts and methods that comprise the invention, without departing from the spirit and scope thereof.

What is claimed is:

1. A method for the precise placement of one or more discrete components on a substrate comprising:
  A. coating said one or more components with a charge control agent;
  B. dispersing said coated components in an aliphatic hydrocarbon diluent containing charge director material;
     wherein said charge control agent and said charge director material interact to impart an ionic charge on the coated components and an oppositely charged micelles in said diluent;
  C. applying a first electrical voltage opposite that of the charge on said components to an image plate having one or more cavities corresponding to the desired placement of said one or more components; thereby pulling said components into said cavities;
  D. placing said substrate proximate to said image plate;
  E. reducing said first electrical voltage and applying a second electrical voltage opposite that of the charge on said components to said substrate;
     thereby pulling and affixing said components to said substrate.

2. The method of claim 1 wherein said one or more cavities and said components are complimentarily tapered to facilitate a desired orientation of said components in said cavities.

3. The method of claim 1 wherein said components are silicon-based die.

4. The method of claim 1 wherein said imaging plate is part of said substrate thereby steps D and E are not needed.

5. The method of claim 1 wherein said charge control agent has an acid or base group available for reaction.

6. The method of claim 5 wherein said charge director reacts with said available acid or base group to form an acid-base complex.

7. A method for the precise placement of one or more discrete components on a substrate comprising:
  F. coating said one or more components with a charge control agent;
  G. dispersing said coated components in an aliphatic hydrocarbon diluent containing charge director material;
     wherein said charge control agent and said charge director material interact to impart an ionic charge on the coated components and an oppositely charged micelles in said diluent; and,
  H. applying an electrical voltage opposite that of the charge on said components to an image plate having one or more cavities conesponding to the desired placement of said one or more components; thereby pulling said components into said cavities.

8. The method of claim 7 wherein said one or more cavities and said components are complimentarily tapered to facilitate a desired orientation of said components in said cavities.

9. The method of claim 7 wherein said components are silicon-based die.

10. The method of claim 7 wherein said charge control agent has an acid or base group available for reaction.

11. The method of claim 10 wherein said charge director reacts with said available acid or base group to form an acid-base complex.

12. The method of claim 7 further comprising step:

D. removing said image plate from said substrate.

* * * * *